US008645117B2

(12) United States Patent
Yin et al.

(10) Patent No.: US 8,645,117 B2
(45) Date of Patent: Feb. 4, 2014

(54) CLOCK SIMULATION DEVICE AND METHODS THEREOF

(75) Inventors: Qichao R. Yin, Austin, TX (US); Jen-Tien Yen, Austin, TX (US); Wai Chee Wong, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 693 days.

(21) Appl. No.: 12/788,769

(22) Filed: May 27, 2010

(65) Prior Publication Data

US 2011/0295586 A1 Dec. 1, 2011

(51) Int. Cl.
*G06F 17/50* (2006.01)

(52) U.S. Cl.
USPC .............................. 703/19; 716/108; 716/113

(58) Field of Classification Search
USPC ................ 703/13, 14, 19; 713/400, 500, 600; 716/108, 113; 708/271
See application file for complete search history.

(56) References Cited

U.S. PATENT DOCUMENTS

| | | | | | |
|---|---|---|---|---|---|
| 3,705,403 | A | * | 12/1972 | Hughes | 342/397 |
| 4,037,257 | A | * | 7/1977 | Chari | 360/51 |
| 5,289,116 | A | * | 2/1994 | Kurita et al. | 324/76.11 |
| 5,313,398 | A | * | 5/1994 | Rohrer et al. | 703/14 |
| 5,339,009 | A | * | 8/1994 | Lai | 315/291 |
| 5,347,559 | A | * | 9/1994 | Hawkins et al. | 377/54 |
| 5,535,377 | A | * | 7/1996 | Parks | 713/400 |
| 5,539,345 | A | * | 7/1996 | Hawkins | 327/150 |
| 5,568,329 | A | * | 10/1996 | Hirohata et al. | 360/32 |
| 5,588,112 | A | * | 12/1996 | Dearth et al. | 714/5.11 |
| 5,721,695 | A | * | 2/1998 | McMinn et al. | 703/14 |
| 5,774,371 | A | * | 6/1998 | Kawakami | 716/113 |
| 5,781,539 | A | * | 7/1998 | Tanaka | 370/312 |
| 5,850,203 | A | * | 12/1998 | Yamazaki et al. | 345/94 |
| 6,388,492 | B2 | * | 5/2002 | Miura et al. | 327/291 |
| 6,567,934 | B1 | * | 5/2003 | Yen et al. | 714/33 |
| 6,775,217 | B1 | * | 8/2004 | Kato et al. | 369/59.2 |
| 7,039,887 | B2 | | 5/2006 | Khalil et al. | |
| 7,080,304 | B2 | * | 7/2006 | Reese | 714/744 |
| 7,343,387 | B2 | * | 3/2008 | Reese | 708/200 |
| 7,478,030 | B1 | * | 1/2009 | Ballagh et al. | 703/19 |
| 7,580,037 | B1 | * | 8/2009 | Iotov | 345/440 |

(Continued)

FOREIGN PATENT DOCUMENTS

| | | |
|---|---|---|
| EP | 1683007 A2 | 7/2006 |
| JP | 2006270739 A | 10/2006 |
| WO | 2005038622 A2 | 4/2005 |

OTHER PUBLICATIONS

Jerry Katz et al., "A New Paradigm in Test for the Next Millennium," ITC International Test Conference, 2000 IEEE, pp. 468-476.

(Continued)

*Primary Examiner* — Omar Fernandez Rivas
*Assistant Examiner* — Kibrom Gebresilassie

(57) ABSTRACT

A pulse width of a simulated external system clock is set by determining a least common multiple of the frequency of selected internal clock signals relative to the frequency of the external system clock. The pulse width can be further adjusted based on the frequency of simulated external clocks. By setting the pulse width of the simulated external system clock based on the least common multiple value, the time required to complete the simulation can be reduced while ensuring proper operation of the simulated clock signals during the simulation.

18 Claims, 8 Drawing Sheets

(56) References Cited

U.S. PATENT DOCUMENTS

| | | | |
|---|---|---|---|
| 7,620,862 B1* | 11/2009 | Lai | 714/725 |
| 7,711,974 B1* | 5/2010 | You et al. | 713/500 |
| 7,813,908 B2* | 10/2010 | Yen et al. | 703/14 |
| 7,817,758 B2* | 10/2010 | Gao | 375/354 |
| 8,018,257 B2* | 9/2011 | Jung | 327/153 |
| 2001/0010475 A1* | 8/2001 | Miura et al. | 327/291 |
| 2003/0163497 A1* | 8/2003 | Reese | 708/271 |
| 2003/0163775 A1* | 8/2003 | Reese | 714/752 |
| 2004/0000939 A1* | 1/2004 | Meguro | 327/160 |
| 2006/0119441 A1* | 6/2006 | Azam et al. | 331/16 |
| 2007/0038909 A1* | 2/2007 | Kim et al. | 714/726 |
| 2007/0089076 A1* | 4/2007 | Amatangelo | 716/6 |
| 2008/0005709 A1* | 1/2008 | Golander | 716/6 |
| 2008/0008283 A1* | 1/2008 | Lee | 375/375 |
| 2008/0174347 A1* | 7/2008 | Oshima | 327/145 |
| 2008/0180043 A1* | 7/2008 | Pruett | 315/307 |
| 2008/0270099 A1* | 10/2008 | Yen et al. | 703/14 |
| 2009/0006894 A1* | 1/2009 | Bellofatto et al. | 714/34 |
| 2009/0168933 A1* | 7/2009 | Gao | 375/354 |
| 2010/0195779 A1* | 8/2010 | Sai | 375/376 |

OTHER PUBLICATIONS

ASIC—System on Chip (SoC)—VLSI Design, Apr. 28, 2010, pp. 1-9.

* cited by examiner

CLOCK SIMULATION DEVICE AND METHODS THEREOF

FIELD OF THE DISCLOSURE

The present disclosure relates generally to data processing devices, and more particularly design tools for data processing devices.

BACKGROUND

Because of their complexity, data processing devices, such as systems on a chip (SOCs) are typically designed using automated design tools, such as a computer-aided design (CAD) system. The CAD system can include automated processes to implement, verify functionality, and improve performance and manufacturability of the data processing device design. To verify functionality, the CAD system simulates input stimuli, such as clock signals, for a data processing device, and simulates the behavior of the device based on the input stimuli. However, verification of functionality can demand an undesirable amount of time, increasing the cost and difficulty of designing the data processing device.

BRIEF DESCRIPTION OF THE DRAWINGS

The present disclosure may be better understood, and its numerous features and advantages made apparent to those skilled in the art by referencing the accompanying drawings.

DETAILED DESCRIPTION

FIGS. 1-8 illustrate a device and techniques for determining a pulse width of one or more simulated clock signals to be generated during simulation of a data processing device. In an embodiment, the pulse width of a simulated external system clock is set by determining a least common multiple of the frequency of selected internal clock signals relative to the frequency of the external system clock. By setting the pulse width of the simulated external system clock based on the least common multiple value, the time required to complete the simulation can be reduced while ensuring proper operation of the simulated clock signals during the simulation.

To illustrate, a data processing device can include a collection of disparate logic modules. Each logic module may be associated with a dedicated clock signal (often referred to as a clock domain). Furthermore, a logic module may be capable of operating at any one of a plurality of clock frequencies. For example, the data processing device may have four processor cores wherein each processor core is associated with a different clock domain. The data processing device can further include a memory controller associated with another clock domain, a high-speed serial interface associated with still another clock domain, and additional modules that are each associated with a different clock domain. During simulation, a clock generator provides each simulated external clock signal to the device design. If the simulated external clock signals are not generated correctly, simulated internal phase locked loop (PLL) devices may not be able to lock to an incoming clock signal, and logic associated with clock signals provided by the PLL device can fail to simulate operation of the device correctly. Accordingly, it is useful to set the pulse width of the simulated external clock signals so that the simulated PLL devices can operate correctly, while reducing the size of the pulse width in order to reduce simulation time.

Figure 1:
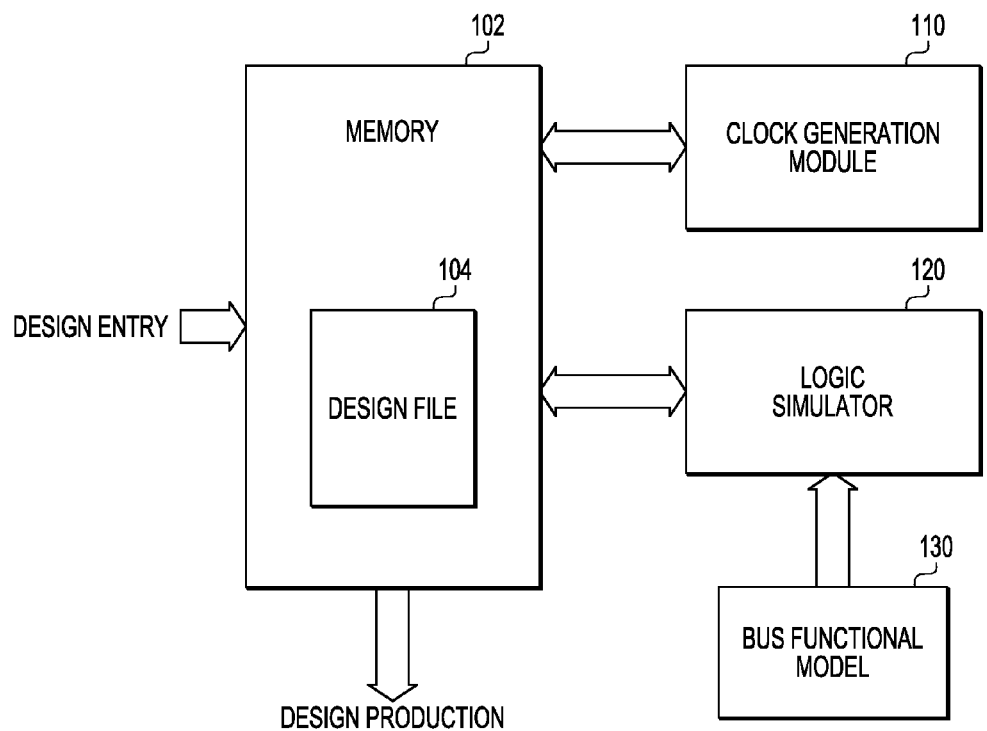
FIG. 1 is a block diagram illustrating a data processing device design system including computer-aided design (CAD) application modules in accordance with a specific embodiment of the present disclosure.

FIG. 1 is a block diagram illustrating a data processing device design system 100 including computer-aided design (CAD) application modules in accordance with a specific embodiment of the present disclosure. The design system 100 is operable to facilitate the design of a data processing device such as an integrated circuit. Design system 100 includes a memory 102, a clock generation module 110, a logic simulator 120, and a bus functional model 130. The memory 102 includes a design file 104. The design file 104 can maintain a representation of the data processing device, which is referred to herein as a device design. For example, the design file 104 can include one or more databases used for storing a representation of a device design and an application programming interface (API) to permit application modules to access and manipulate device design attributes. Further, the design file 104 can represent a device using one or more models and views. For example, the design file 104 can include a register-transfer level (RTL) model that provides a functional description of the device, a gate level representation of the device, and a transistor level representation of the device. Application modules such as the clock generation module 110 and the logic simulator 120 can be configured to manipulate and analyze device design information included at the design file 104 to transform the representation of the device in a desired way. During the design process, the representation of the device at the design file 104 can evolve and mature. For example, based on simulations of the data processing device, the device design can be altered so that the design complies with a specification. The changes to the device design can be reflected by corresponding changes to the design file 104 to provide for further simulation and testing of the device design. Once the design process is complete, the device design can be used to manufacture the data processing device. For example, the design file 104 can include a representation of a data processing device design that includes information relating to physical photo-mask features that can be provided to an integrated circuit manufacturing facility.

In one embodiment, the application modules 110 and 120 can include hardware modules, software modules, or a combination thereof. Each application module can be executed as described herein to perform an associated design function. The design system 100 can include additional application modules (not shown at FIG. 1) that are associated with other aspects of the design process.

The clock generation module 110 is operable to generate simulated clock signals to be used during simulation of a data processing device based on the design file 104. The clock generation module 110 can evaluate multiple criteria to determine and configure a pulse width associated with one or more clock signals to be provided to a device design during a simulation procedure. For example, the clock generation module 110 can evaluate the frequency of external clock signals provided to the device design, information describing how the external clock signals are manipulated within the device design, and other configuration information. The clock generation module 110 can determine a minimum pulse width of each external clock signal based on this set of information.

The logic simulator 120 is a device operable to simulate operation of the device based on the design file 104 to verify logical functionality of the device design. Bus functional model 130 can include a representation of other logic modules to facilitate simulation of the device design. For example, the bus functional model 130 can include a representation of a memory device or a peripheral chip-set that, together with the data processing device represented by the device design, implements an information handling system. During a simulation of the device design, the bus functional model 130 can interact with the simulated device design to model the behavior of the information handling system and determine the device's predicted behavior in the system.

The logic simulator 120 can include a commercially available logic simulator, such as a Verilog simulator, a proprietary logic simulator, or a combination thereof, to simulate the operation of the configuration of logic gates and other modules reflected by the design file 104. Further, the logic simulator 120 can use the simulated clock signals provided by the clock generation module 110 during the simulation process to simulate device behavior. For example, the logic simulator 120 can employ the simulated clock signals to control the timing of events at the modules reflected by the design file 104 in order to simulate the behavior of a data processing device that is based on the device design. This can be better understood with reference to FIG. 2.

Figure 2:
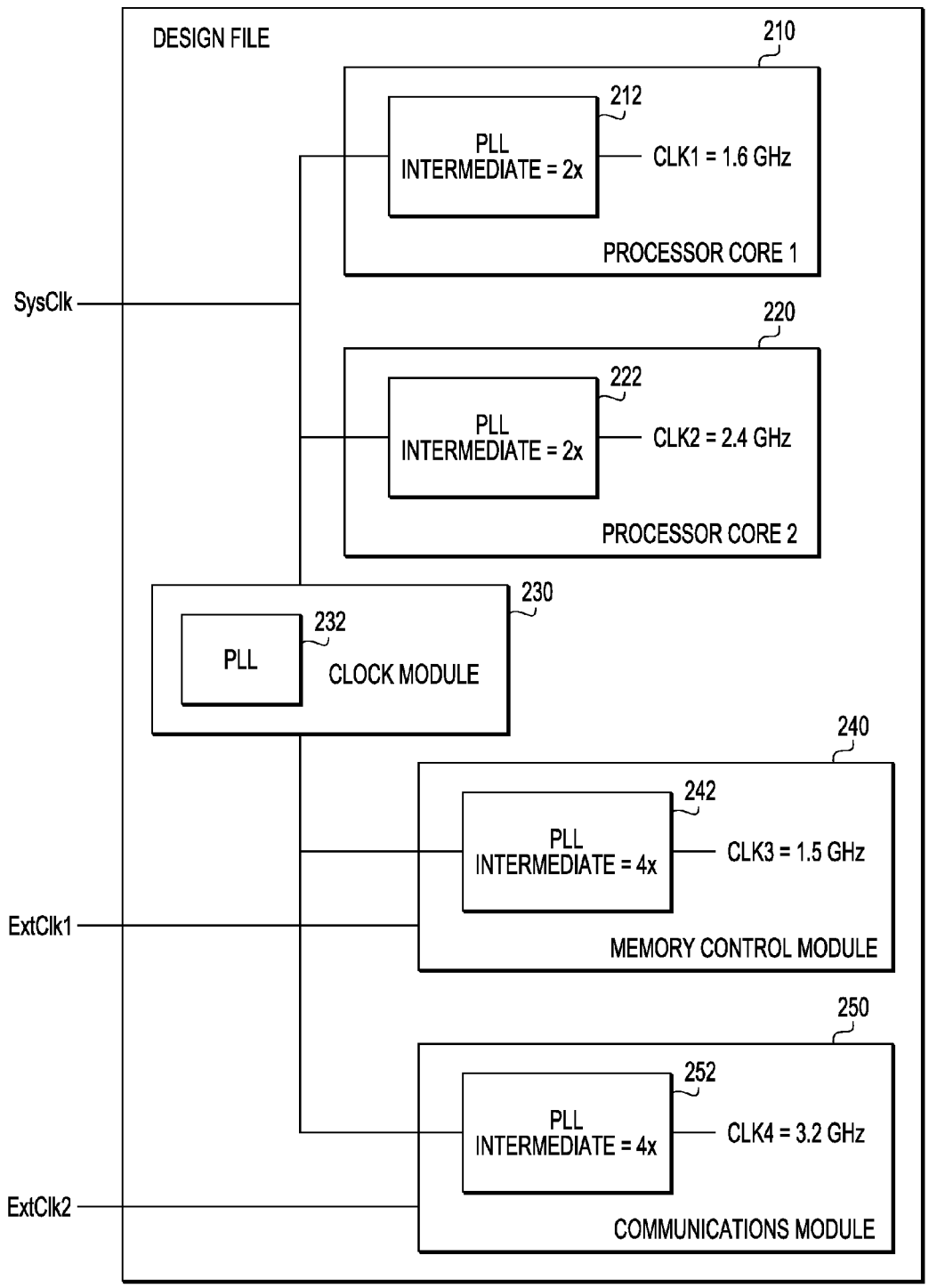
FIG. 2 is a block diagram illustrating a representation of a data processing device design maintained at a design file of the data processing device design system of FIG. 1 in accordance with a specific embodiment of the present disclosure.

FIG. 2 is a block diagram illustrating a representation of a data processing device design 200 based on the design file 104 of FIG. 1 in accordance with a specific embodiment of the present disclosure. The data processing device design 200 is an example of a device design that can be implemented with the aid of design system 100. The data processing device design 200 includes processor cores 210 and 220, a clock module 230, a memory control module 240, and a communications module 250. The data processing device design 200 can include additional modules that are not shown at FIG. 2.

The processor core 210 includes a phase locked loop (PLL) 212, the processor core 220 includes a PLL 222, the clock module 230 includes a PLL 232, the memory control module 240 includes a PLL 242, and the communications module 250 includes a PLL 252. Each of the modules 210, 220, 230, 240, and 250 can include additional PLL devices and other modules that are not illustrated.

The data processing device design 200 includes a clock system having terminals for receiving external clock signals labeled SysClk, ExtClk1, and ExtClk2. As used herein, an external clock signal, with respect to design file 104, refers to a signal that simulates a signal to be provided to the data processing device from a source external to the device. The PLL 212 at the processor core 210 receives the external system clock signal SysClk and provides a local clock signal labeled CLK1 for use by the processor core 210. A local clock signal is a signal generated internally by the data processing device for use by one or more modules of the device. The PLL 222 at the processor core 220 receives the clock signal SysClk and provides a local clock signal labeled CLK2. The PLL 232 at the clock module 230 receives the clock signal SysClk and provides a platform clock signal labeled PltFrmClk. The PLL 242 at the memory control module 240 receives the platform clock signal PltFrmClk and provides a local clock signal labeled CLK3. The PLL 252 at the communications module 250 receives the platform clock signal PltFrmClk and provides a local clock signal labeled CLK4.

Clock signals CLK1, CLK2, CLK3, and CLK4 are referred to as domain clock signals. Each domain clock signal controls the synchronous operation of logic modules included in the corresponding clock domain. For example, clock signal CLK1 is the domain clock signal associated with the processor core 210. In an embodiment, the clock domain associated with the clock signal CLK1 operates at a frequency of 1.6 GHz, clock signal CLK2 has a frequency of 2.4 GHz, clock signal CLK3 has a frequency of 1.5 GHz, and clock signal CLK4 has a frequency of 3.2 GHz.

A domain clock signal can be generated from another clock signal (herein referred to as an intermediate clock signal) having a frequency that is a multiple of the frequency of the domain clock signal. Generating a domain clock signal using an intermediate clock signal can improve the duty cycle and waveform uniformity of the generated domain clock. For the purpose of the present example, it is assumed that the PLL 212 includes an intermediate clock signal having a frequency that is twice that of clock signal CLK1 (3.2 GHz). The PLL 222 also includes a corresponding intermediate clock signal having a frequency twice that of their respective clock domain signals. The PLL 242 and the PLL 252 each include an intermediate clock signal having a frequency that is four times that of clock signal CLK3 and clock signal CLK4, respectively.

The PLL devices 212, 222, 232, 242, and 252 can each be configured to process a clock signal received at the PLL's input terminal and to provide a related clock signal at an output terminal at a designated frequency that may differ from the frequency of the input clock signal by a multiplicative factor. Furthermore, a PLL may be operable to provide any one of a plurality of frequency-multiples based on how the PLL is configured. For example, the frequency of clock signal SysClk may be 100 MHz, and the PLL 212 can be configured to generate clock signal CLK1 having a frequency of 800 MHz, 1000 MHz, 1600 MHz, or another frequency. The corresponding clock-multiple provided by a PLL, such as PLL devices 212, 222, 232, 242, and 252, can be individually configured during operation of the data processing device, or the PLL device can be configured during an initialization procedure, such as in response to an assertion of a reset signal (not shown at FIG. 2).

Each of the external clock signals SysClk, ExtClk1, and ExtClk2, as well as the platform clock signal PltFrmClk, can also be configured to operate at one of multiple frequencies. Accordingly, the data processing device design 200 provides for a large number of possible clock signal configurations depending on how each PLL is configured and depending on the frequency of the external clock signals.

During simulation of a data processing device based on the device design 200, the logic simulator 120 (FIG. 1) assesses the state of the simulation, and enforces changes in the simulation state, at selected intervals. The logic simulator 120 determines the timing of the selected intervals based on an internal clock reference, referred to herein as a simulation clock. Accordingly, the timing of the clock signals received and generated by the PLLs 212, 222, 232, 242, and 252 is based on the relationship of these clock signals to the simulation clock. Thus, each of the clock signals can be expressed as a function of the simulation clock. For example, each interval at which the logic simulator 120 evaluates the simulation state or enforces changes in the simulation state can be referred to as a simulation clock time unit. Each of the clock signals received and generated by the PLLs 212, 222, 232, 242, and 252 can be expressed according to the number of simulation clock time units associated with a pulse of the clock signal. Thus, for example, the pulse width of the clock signal SysClk can be 1000 simulation clock time units, while the clock signal generated by PLL 212 can be 2000 simulation clock time units. The design file 104 can store the number of simulation time units associated with each clock signal, so that the logic simulator 120 can determine the relative timing of events dependent on each clock signal during simulation. The clock generation module 110 (FIG. 1) can determine the pulse width, expressed in simulation time units, for each clock signal based on configuration information stored at the design file 104. This can be better understood with reference to FIG. 3.

Figure 3:
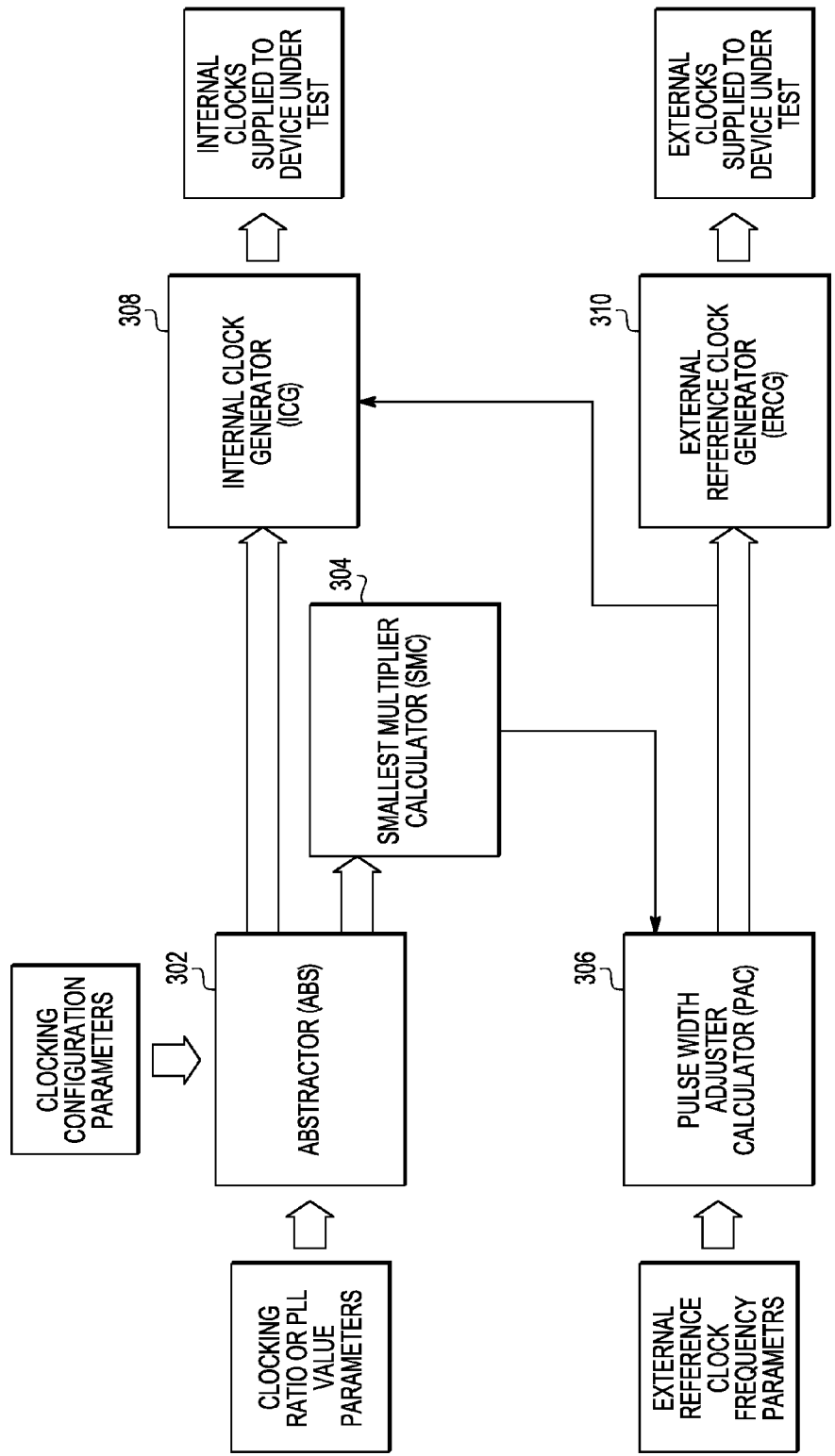
FIG. 3 is a block diagram illustrating a clock generation module of FIG. 1 in accordance with a specific embodiment of the present disclosure.

FIG. 3 is a block diagram illustrating the clock generation module 110 of FIG. 1 in accordance with a specific embodiment of the present disclosure. The clock generation module 110 includes an Abstractor (ABS) 302, a smallest multiplier calculator (SMC) 304, a pulse width adjuster calculator (PAC) 306, an internal clock generator (ICG) 308, and an external reference clock generator (ERCG) 310. The clock generation module 110 is operable to receive information representing PLL frequency-multiplier values or other internal clock-ratios, clocking configuration parameters, and frequency information associated with external clocks from the design file 104. The clock generation module 110 processes this information to determine a desired pulse width for each external clock. The clock generation module 110 can also determine pulse width information corresponding to internal clocks that can be applied to internal nodes of the device design during a simulation of the device design.

The ABS 302 is configured to receive configuration information from the design file 104, from a user via a graphical user interface (GUI), or a combination thereof. Based on the configuration information, the ABS 302 identifies each clock signal of the device design and determines the operating frequency of each clock signal relative to the frequency of a system clock signal. In particular, the ABS 302 is configured to evaluate each clock domain within the device design to determine a relationship between the frequencies of all domain and intermediate clock signals within the design. In an embodiment, the frequency of each internal clock signal is expressed as a ratio to the frequency of an external system clock signal, such as system clock signal SysClk at the data processing device 200 of FIG. 2. The ABS 302 can process information including a frequency-multiplication factor associated with each PLL at the device design, and information describing how the clock network is interconnected and configured. This can be better understood referring to the example of FIG. 2.

To illustrate, the information received at the ABS 302 can include frequency multiplication factors provided by each of the PLL 212, the PLL 222, the PLL 232, the PLL 242, and the PLL 252. The ABS 302 also can receive clock network connectivity information from the design file 104. For example, the ABS 302 can determine that clock signal CLK3 provided by the PLL 242 is generated based on the platform clock signal PltFrmClk (referred to herein as synchronous operation), while the clock signal CLK1 provided by the PLL 212 is generated based on the system clock signal SysClk (referred to herein as asynchronous operation). The ABS 302 can determine a frequency relationship between each clock signal and the system clock signal SysClk, and provides this information to the SMC 304. Table 1 below illustrates an example configuration of the data processing device design 200 and information determined by the ABS 302.

TABLE 1

| Clock signal | Synchronous? | PLL multiplier (domain clock) | Intermediate clock multiplier | Freq ratio (relative to SysClk) |
|---|---|---|---|---|
| CLK1 | No | 16 (PLL 212) | 2 | 32 |
| CLK2 | No | 24 (PLL 222) | 2 | 48 |
| PltFrmClk | N/A | 2 (PLL 232) | 1 | 2 |
| CLK3 | Yes | 15 (PLL 242) | 4 | 60 |
| CLK4 | Yes | 16 (PLL 252) | 4 | 64 |

The PLL 212 provides the clock signal CLK1, which is the domain clock associated with the processor core 210. For the present example, clock signal CLK1 is assumed to have a frequency of 1.6 GHz. That is, it is assumed that the PLL 212 is configured to multiply the frequency of system clock signal SysClk (100 MHz) by a factor of 16. The PLL 212 includes an intermediate clock having a frequency that is twice that of clock signal CLK1, or 3.2 GHz. Therefore, the frequency ratio of the highest frequency clock at the processor core 210, relative to system clock signal SysClk, is 32. The PLL 222 provides the clock signal CLK2, which is the domain clock associated with the processor core 220. For the present example, clock signal CLK2 is assumed to have a frequency of 2.4 GHz. In other words, it is assumed that the PLL 222 is configured to multiply the frequency of system clock signal SysClk by a factor of 24. The PLL 222 includes an intermediate clock having a frequency that is twice that of clock signal CLK2, or 4.8 GHz. Therefore, the frequency ratio of the highest frequency clock at the processor core 220, relative to system clock signal SysClk, is 48.

The platform clock signal PltFrmClk is provided by the PLL 232, which multiplies the frequency of the system clock signal SysClk by a factor of two. The platform clock signal PltFrmClk is used to generate clock signals CLK3 and CLK4. Therefore, clock signals CLK3 and CLK4 are referred to herein as synchronous clock signals. The PLL 242 provides the clock signal CLK3, which is the domain clock associated with the memory control module 240. For the present example, clock signal CLK3 is assumed to have a frequency of 1.5 GHz. For example, the PLL 222 can be configured to multiply the frequency of the platform clock signal PltFrmClk by a factor of 7.5. The PLL 242 includes an intermediate clock having a frequency that is four times that of clock signal CLK3, or 6.0 GHz. Therefore, the frequency ratio of the highest frequency clock at the memory control module 240, relative to system clock signal SysClk, is 60. The PLL 252 provides the clock signal CLK4, which is the domain clock associated with the communications module 240. For the present example, clock signal CLK4 is assumed to have a frequency of 3.2 GHz. In other words, the PLL 252 is configured to multiply the frequency of the platform clock signal PltFrmClk by a factor of 16. The PLL 252 includes an intermediate clock having a frequency that is four times that of clock signal CLK4, or 6.4 GHz. Therefore, the frequency ratio of the highest frequency clock at the communications module 250, relative to system clock signal SysClk, is 64.

The set of frequency ratios (32, 48, 2, 60, and 64) is provided to the SMC 304. In an embodiment, the ABS 302 can exclude one or more logic modules from consideration by the SMC 304. For example, if the configuration information indicates that processor core 220 is not active during a particular simulation, the frequency ratio of clock signal CLK2 is not provided to the SMC 304. In another embodiment, the ABS 302 can supply clock signal information to the ICG 308, identifying nodes within a device design that are to be directly driven with generated clock signals. For example, if the design of a portion of the device design 200 that generates or otherwise propagates an internal clock signal for use by another logic module has not been completed, the clock signal that ultimately will be provided by the missing block can be synthesized by the ICG 308 using information provided by the ABS 302 and the PAC 306.

The SMC 304 performs a mathematical computation based on the frequency ratios received from the ABS 302, to calculate a least common multiple of the frequency ratios. A least common multiple of a set of values is the smallest whole number that is divisible by each of the values without a remainder. For example, based on the previous example, the least common multiple (LCM-D) of the values 32, 48, 2, 60, and 64, is equal to 960. The calculated least common multiple, LCM-D, determined based on the domain clocks, is provided to the PAC 306 for used in subsequent calculations.

The PAC 306 calculates the pulse width of each external clock received by the device design during simulation based on the least common multiple (LCM-D) provided by the SMC 304 and based on a relationship between the frequency of the system clock SysClk and the frequency of other external clocks ExtClk(n) as indicated by the configuration information. In an embodiment, the PAC 306 calculates the pulse width by calculating a least common multiple (LCM) of the frequency of each of the external clock signals;

LCM=least common multiple of{SysClk,ExtClk(n)}

The PAC 306 then determines a relationship between the LCM and the frequency of the system clock SysClk and the frequency of each additional external (reference) clock signals ExtClk(n) as follows:

CPWS=LCM/SysClk frequency

CPWE(n)=LCM/ExtClk(n)frequency

The PAC 306 further calculates a scale-up factor (SUF) as follows:

SUF=(least common multiple of LCM-D and CPWS)/CPWS

The PAC 306 then determines a pulse width (PW) for the system clock signal SysClk and each external clock signal ExtClk(n) according to the following:

PW(SysClk)=CPWS*SUF

PW(ExtClk(n))=CPWE(n)*SUF

Table 2 below illustrates the preceding calculations with reference to the device design 200 of FIG. 2 and the previous example illustrated at Table 1.

TABLE 2

| Clock | Frequency (MHz) | LCM | CPW | SUF | PW |
|---|---|---|---|---|---|
| SysClk | 100 | 2500 | CPWS = 25 | 192 | 4800 |
| ExtClk1 | 125 | | CPWE1 = 20 | | 3840 |
| ExtClk2 | 156.25 | | CPWE2 = 16 | | 3072 |

Accordingly, the pulse width values 4800, 3840, and 3072 are provided to the ERCG 310 to represent the pulse width of system clock signal SysClk, external clock signal ExtClk1, and external clock signal ExtClk2, respectively.

The ERCG 310 is configured to translate the pulse width information received from the PAC 306 into a format compliant with the logic simulator 120. In particular, the ERCG 310 translates the pulse width information into the corresponding number of simulation clock time units, and formats the translated information into a syntax that can be interpreted by the logic simulator 120. For example, the ERCG can express a clock signal representing system clock SysClk according to Verilog syntax as follows:

Initial SysClk=0;

Always #4800 SysClk=~SysClk which will instruct the logic simulator 120 to produce a continuous pulse stream wherein the system clock signal SysClk is set to a logic-low level for 4800 simulation clock time units, transitioning to a logic-high level where it remains for another 4800 time units before transitioning back to a logic-low level. Thus, clock signal SysClk transitions every 4800 simulation clock time units and has a total period of 9600 simulation clock time units.

The pulse widths of other clock signals can be determined by the logic simulator 102, based on the frequency relationship between the corresponding clock signal and SysClk. For example, the logic simulator 120 will determine that, because clock signal PltFrmClk is twice the frequency of SysClk, the clock signal has a pulse width that is half of the pulse width of SysClk. Because the pulse width of SysClk is based on the calculated least common multiple, the pulse width of each of the clock signals to be simulated can be expressed as an integer value of simulation clock time units. Because the logic simulator 120 evaluates the state of the simulation for each simulation clock time unit, the expression of the pulse width of each clock signal as an integer value allows the simulator to properly simulate the behavior of the logic modules that are synchronized by the clock signals. To illustrate, if a pulse width of a clock signal were expressed by a non-integer (e.g. fractional) value, the signal would transition between simulation clock time units. Accordingly, behavior resulting from the signal transition would not be properly simulated by the logic simulator 120.

Returning to FIG. 3, the operation of the ICG 308 is similar to that of the ERCG 310, except the ICG 310 provides clock signals to logic nodes internal to the device design that is being simulated rather than to external terminals of the device design. For example, if the design of clock module 230 of FIG. 2 is not complete, simulation of the data processing device design 200 can be supported by synthesizing platform clock signal PltFrmClk using information provided by the ABS 302 and by the PAC 306. The synthesized clock signal can be injected at the node corresponding to the platform clock signal PltFrmClk, which can be received at the memory control module 240 and at the communications module 250.

Figure 4:
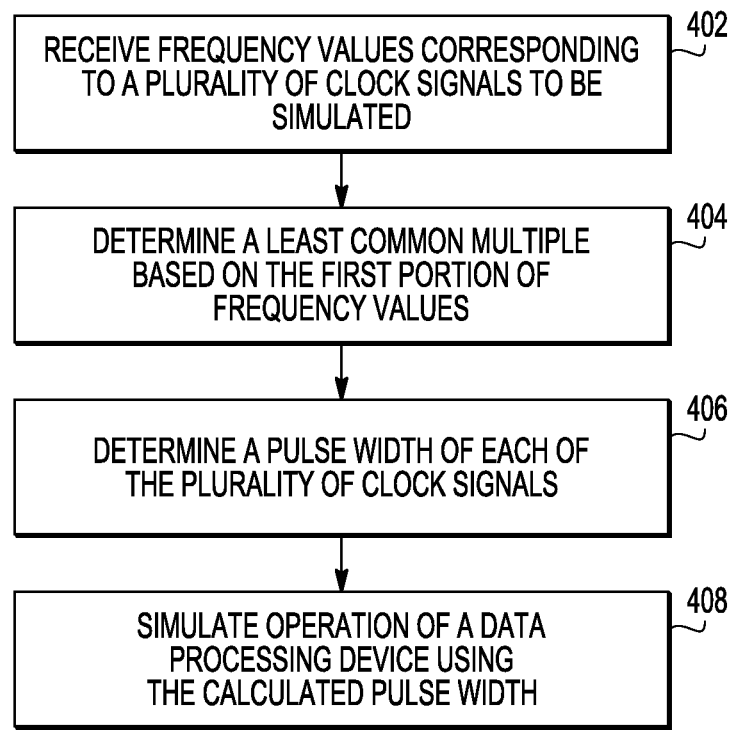
FIG. 4 is a flow diagram illustrating a method for simulating the operation of the data processing device design system of FIG. 1 in accordance with a specific embodiment of the present disclosure.

FIG. 4 is a flow diagram illustrating a method 400 for simulating the operation of the data processing device design system of FIG. 1 in accordance with a specific embodiment of the present disclosure. Method 400 begins at node 402 where frequency values corresponding to a plurality of clock signals that are to be simulated are received. For example, the ABS 302 at the clock generation module 110 can determine a relationship (ratio) between the frequency of each clock signal (corresponding to a unique clock domain such as clock signals CLK1, CLK2, etc) and the frequency of an external system clock signal (such as the system clock signal SysClk). The flow proceeds to node 404 where a least common multiple is calculated based on the plurality of clock signals. For example, a ratio is determined for each clock domain expressing the relative frequency of each clock signal to the frequency of an external system clock signal. A least common multiple (LCM-D) can be calculated based on the set of ratios. The flow proceeds to node 406 where a pulse width of each of a second portion of the plurality of clock signals is determined based on the least common multiple. For example, the PAC 306 can calculate a suitable pulse width for each external clock signal provided to a device design during a simulation procedure based on the value LCM-D and further based on a relationship between the frequencies of each of a set of external clock signals. The flow proceeds to node 408 where operation of a data processing device can be simulated using the calculated pulse width information. For example, pulse width information corresponding to each external clock signal of a device design can be provided to a logic simulator, such as the logic simulator 120, which can simulate operation of the device design maintained at the design file 104.

Figure 5:
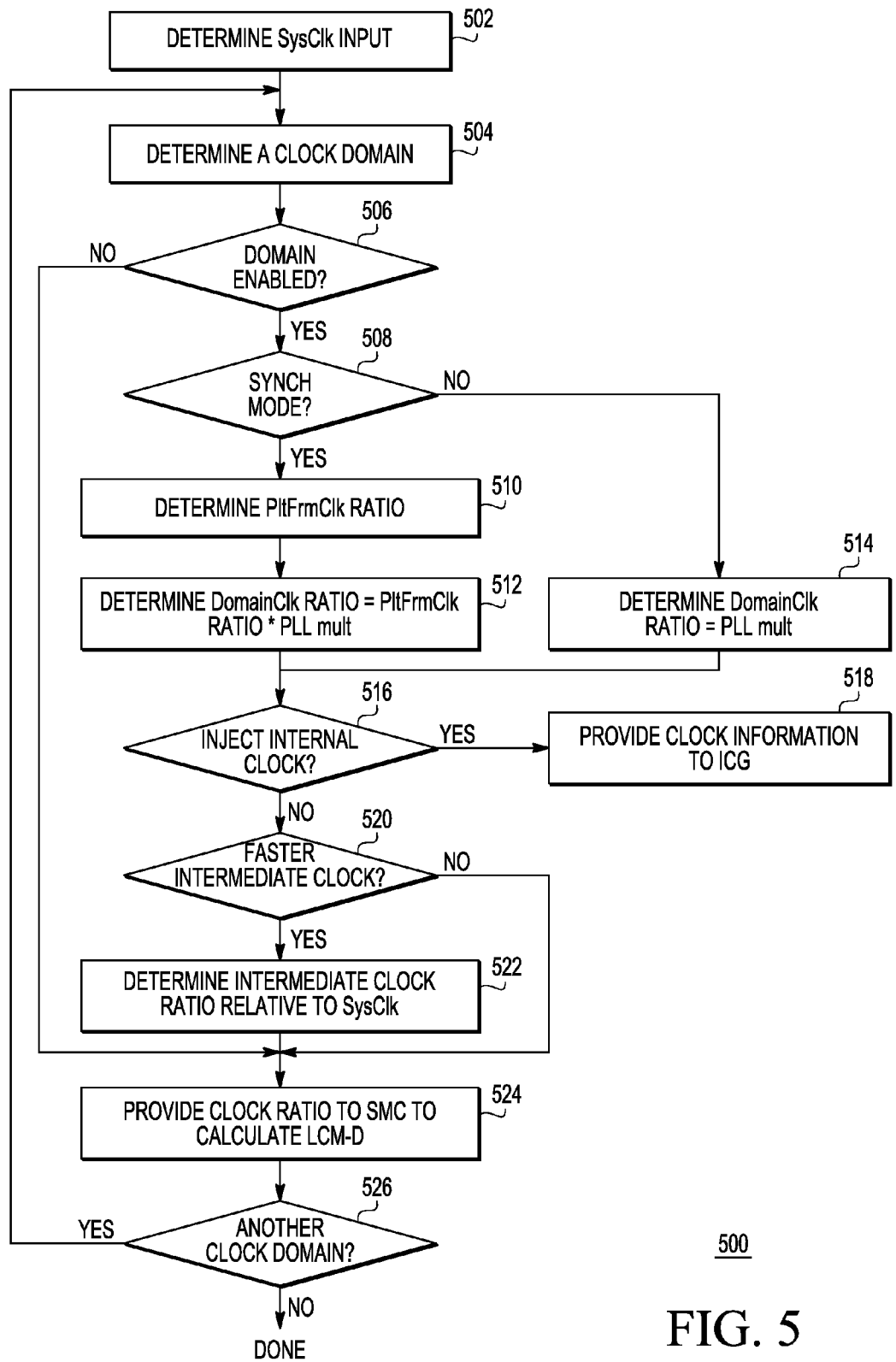
FIG. 5 is a flow diagram illustrating a method for determining a least common multiple of the frequency of multiple clock signals included at the data processing device design in accordance with a specific embodiment of the present disclosure.

FIG. 5 is a flow diagram illustrating a method 500 for determining a least common multiple of the frequency of multiple clock signals included at the data processing device design in accordance with a specific embodiment of the present disclosure. Method 500 corresponds to the operation of the ABS 302 and of the SMC 304 of the clock generation module 110, and begins at node 502 where a primary system clock is identified. For example, the ABS 302 can determine that the signal SysClk corresponds to the system clock at the data processing device design 200. The flow proceeds to node 504 where a clock domain is identified. For example, the ABS 302 can use device design information provided by the design file 104 to determine that the clock signal CLK1 at the data processing device design 200 represents a first clock domain. The flow proceeds to decision node 506 where the ABS 302 determines whether the clock domain presently under consideration is enabled to be simulated. If the present clock domain is enabled to be simulated, the flow proceeds to decision node 508. If the present clock domain is not enabled to be simulated, the flow proceeds to decision node 524 where it is determined if the device design includes another clock domain. At decision node 508, it is determined whether the present clock domain is synchronous or asynchronous. As used herein, the term synchronous is used to describe a clock signal derived from a platform clock signal, such as platform clock signal PltFrmClk at FIG. 2.

If the present clock domain is synchronous, the flow proceeds to node 510 where a ratio between a platform clock signal and the system clock signal is determined. For example, in the example described above, the PLL 232 of the clock module 230 at the data processing device design 200 is configured to multiply the frequency of the system clock signal SysClk by a factor of two. The flow proceeds to node 512 where a domain frequency ratio is determined for the present domain clock signal based on the platform clock ratio and based on a PLL multiplier ratio associated with the present domain clock. For example, the domain clock signal CLK3 of the memory control module 240 has a frequency that is fifteen times that of system clock signal SysClk (a factor of two provided by the PLL 232 and a factor of 7.5 provided by the PLL 242). Returning to decision block 508, if the domain is asynchronous, the flow proceeds to node 514 where a domain frequency ratio is determined for the present domain clock based only on a PLL multiplier ratio associated with the present domain clock. For example, domain clock signal CLK1 of the processor core 210 has a frequency that is sixteen times that of the system clock SysClk, based on the multiplier ratio provided by the PLL 212).

The flow proceeds from nodes 512 and 514 to decision node 516, where it is determined whether the present domain clock is to be injected at an internal node of the device design being simulated. If the present domain clock signal is to be injected, the flow proceeds to node 518, where the frequency ratio information is provided to an internal clock generator. For example, the ICG 308 is operable to generate an internal clock signal and inject the signal at a designated node within the device design. If the present domain clock signal is not to be injected, the flow proceeds to decision node 520, where it is determined whether the clock domain includes an intermediate clock signal that is operating at a frequency that is greater than that of the primary domain clock signal. For example, an intermediate clock signal at the PLL 212 has a frequency that is twice that of the domain clock signal CLK1. If a faster intermediate clock is identified, the flow proceeds to node 522 where the additional multiplicative factor is included, and the frequency ratio associated with the present clock domain is based on the higher frequency of the intermediate clock signal. The flow then proceeds to node 254.

Returning to decision block 520, if there are no higher frequency intermediate clocks included within the present clock domain, the frequency ratio associated with the present clock domain is the ratio determined at node 512 or at node 514, and the flow proceeds to node 524. At node 524, the frequency ratio associated with the present clock domain is provided to the SMC 304 to be used to calculate a least common multiple LCM-D. The flow proceeds to decision node 526 where it is determined whether another clock domain remains to be processed. If another clock domain has not yet been considered, the flow returns to node 504, otherwise method 500 terminates. Accordingly, a frequency ratio corresponding to each clock domain is reported to the SMC 304, which calculates a least common multiple (LCM-D) based on the set of clock frequency ratios.

Figure 6:
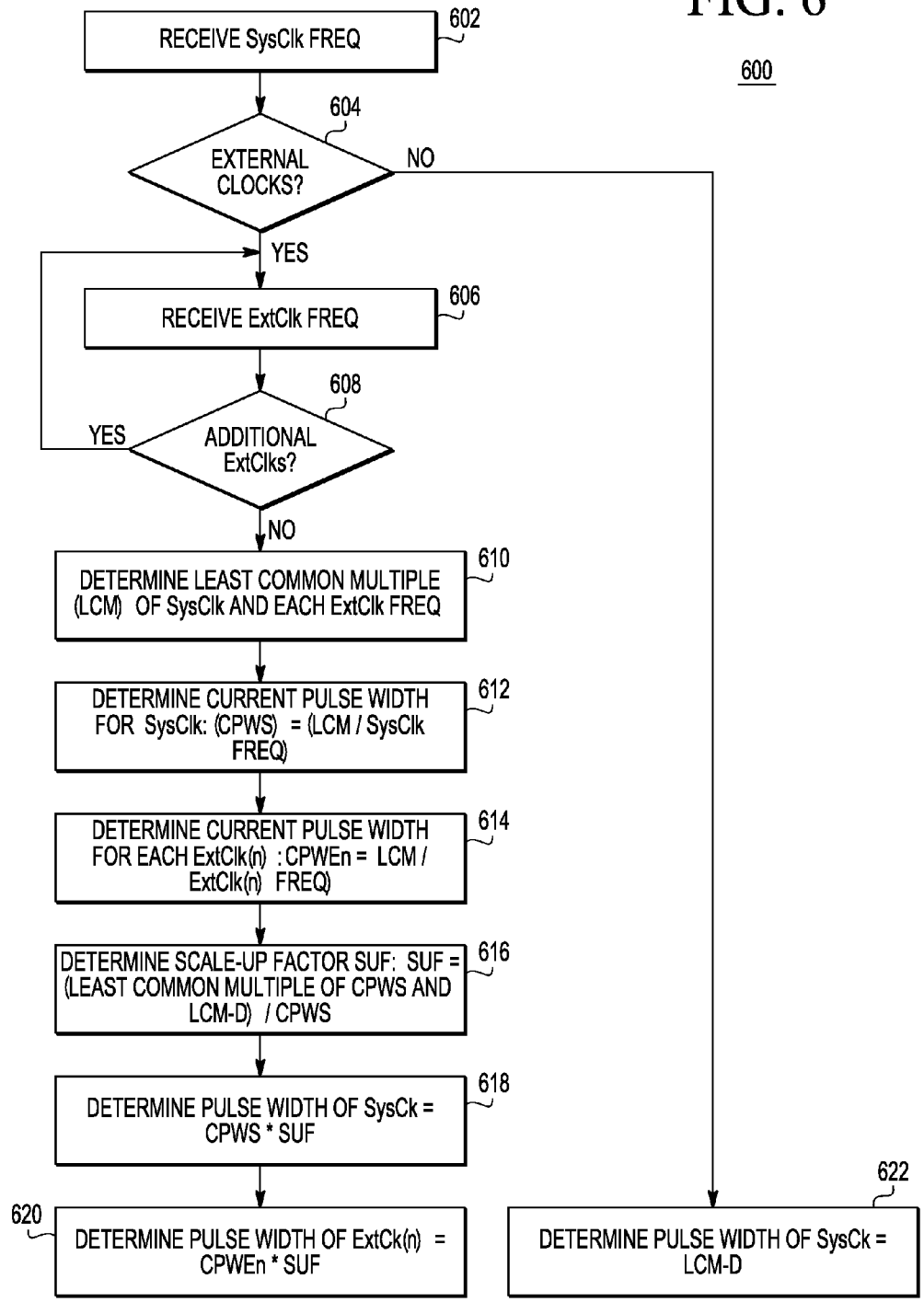
FIG. 6 is a flow diagram illustrating a method for determining pulse widths of clock signal provided to a simulation of the data processing device design in accordance with a specific embodiment of the present disclosure.

FIG. 6 is a flow diagram illustrating a method 600 for determining pulse widths of clock signal provided to a simulation of the data processing device design in accordance with a specific embodiment of the present disclosure. Method 600 corresponds to the operation of the PAC 306 of the clock generation module 110, and begins at node 602 where a frequency associated with the system clock signal is received. Continuing with the previous example and particularly with reference to Table 2, above, the frequency of the system clock signal SysClk is determined to be 100 MHz. The flow proceeds to node 604 where it is determined whether the device design includes additional external clocks. If there are other external clocks, the flow proceeds to nodes 606 and 608 where the frequency of each external clock is determined, and the flow proceeds to node 610. Returning to decision block 604, if the system clock is the only external clock signal, the flow proceeds to node 622 where the pulse width of the system clock signal is set to a value equal to the least common multiple of the domain clocks (LCM-D) determined by the SMC 304 based on the frequency ratios identified using method 500.

If there exists one or more external clock signals in addition to the system clock signal, the flow continues at node 610, where a least common multiple (LCM) is calculated based on the set of external clock frequencies. For example, at column 3 of Table 2, the value of LCM is determined to be 2500 based on the set of three external clock frequencies (100, 125 and 156.25 MHz). The flow proceeds to node 612 where a current pulse width corresponding to the system clock signal (CPWS) is calculated by dividing the value LCM by the frequency of the system clock signal. For example, at column 4 of Table 2, the current pulse width of the system clock signal SYSCLK is 25 (2500/100). The flow proceeds to node 614 where a current pulse width correspond to each of all additional external clock signals is calculated in the same manner as described with reference to node 612. For example, the current pulse width of the external clock signal ExtClk1 is 20 (2500/125), and the current pulse width of the external clock signal ExtClk2 is 16 (2500/156.25).

The flow proceeds to node 616 where a scale up factor SUF is determined by calculating a least common multiple of the value LCM-D and the value CPWS, and dividing the result by CPWS. Referring again to Table 2, the least common multiple of LCM-D and CPWS (960 and 25, respectively) is equal to 4800, which when divided by CPWS, provides a scale up factor SUF=192. The flow proceeds to node 618 where a pulse width of the system clock signal can be determined by multiplying the value CPWS by the value SUF. As seen at the final column of Table 2, the pulse width for signal SysClk is determined to be 4800 (25*192). The flow proceeds to node 620 where a similar calculation can be performed for each of the remaining external clock signals. For example, the pulse width of the external clock signal ExtClk1 is 3840 (20*192), and the pulse width of the external clock signal ExtClk2 is 3072 (16*192). The calculated set of pulse width values can be provided to the ERCG 310, which can generate the appropriate clock signals for simulation by the logic simulator 120.

Figure 7:
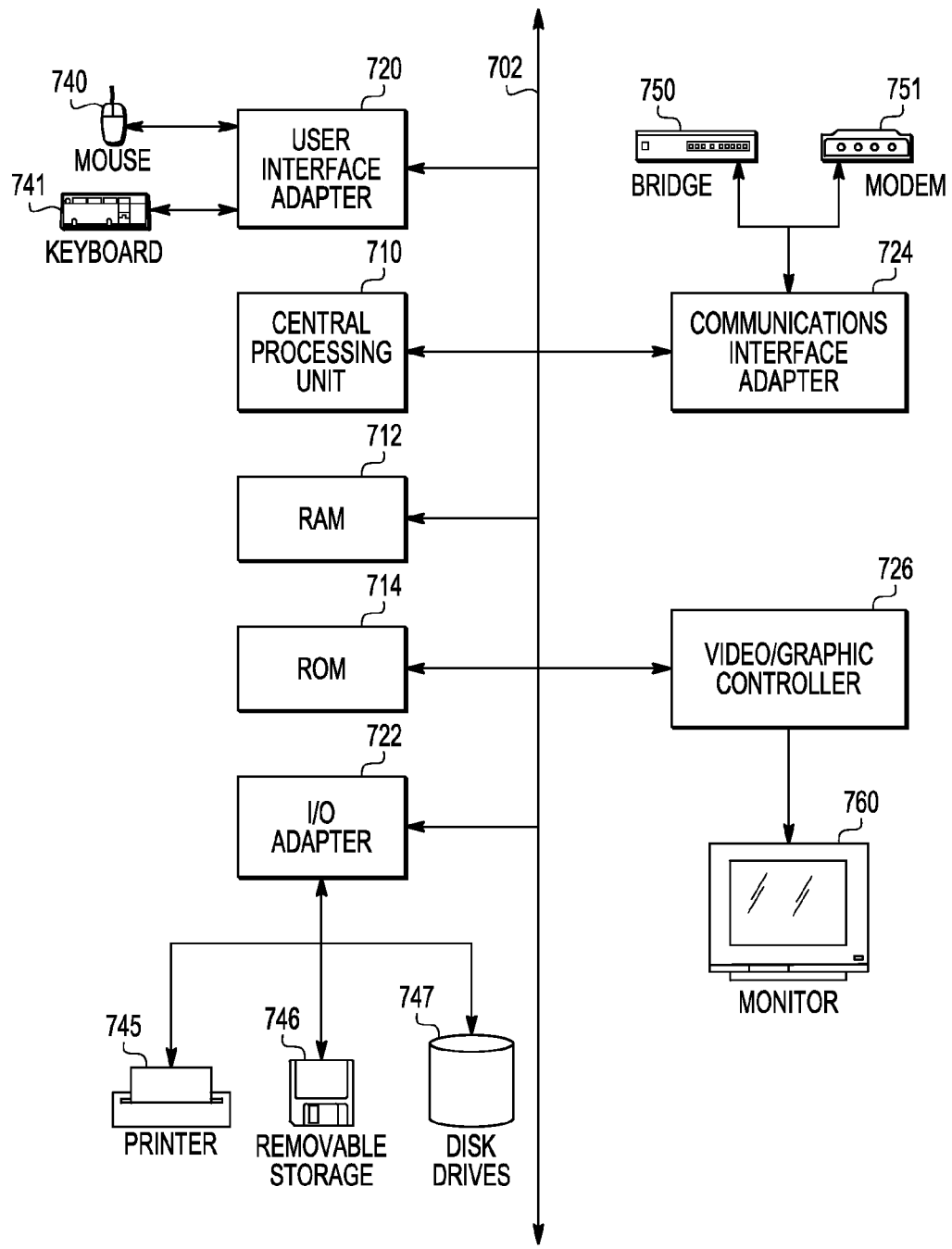
FIG. 7 is a block diagram illustrating a processing device in the form of a computer system in accordance with a specific embodiment of the present disclosure.

FIG. 7 is a block diagram illustrating a processing device in the form of a computer system 700 in accordance with a specific embodiment of the present disclosure. The computer system 700 is illustrated to include devices connected to each other a central processing unit 710, which may be a conventional proprietary data processor, memory including a random access memory 712, a read only memory 714, and an input output adapter 722, a user interface adapter 720, a communications interface adapter 724, and a multimedia controller 726. Generally, the system 700 will be capable of implementing the system and methods described herein. For example, the design file 104 to be accessed and manipulated by the method described herein can be stored at disk drive 747 or at memory 712 and accessed by CPU 710 in response to an instruction.

Input output (I/O) adapter 722 is further connected to, and controls, disk drives 747, printer 745, removable storage devices 746, as well as other standard and proprietary I/O devices. User interface adapter 720 can be considered a specialized I/O adapter. The Adapter 720 is connected to a mouse 740, and a keyboard 741. In addition, user interface adapter 720 may be connected to other devices capable of providing various types of user control, such as touch screen devices. The communications interface adapter 724 is connected to a bridge 750 such as is associated with a local or a wide area network, and a modem 751. System bus 702 can be connected to various communication devices to access external information. Multimedia controller 726 will generally include a video graphics controller capable of displaying images upon the monitor 760, as well as providing audio to external components (not illustrated).

Figure 8:
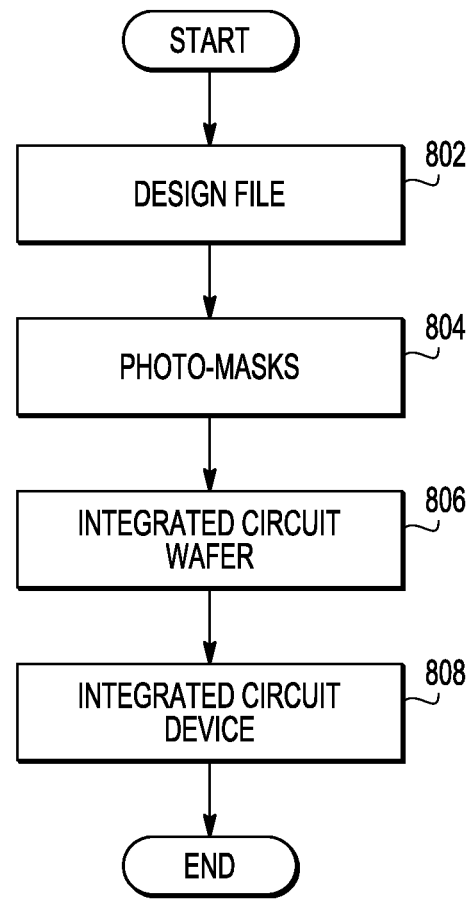
FIG. 8 is a flow diagram illustrating another method in accordance with a specific embodiment of the present disclosure.

FIG. 8 is a flow diagram illustrating another method 800 in accordance with a specific embodiment of the present disclosure. At node 802 information included at a design file, such as design file 104, is provided to a photo-lithography facility. For example, design file 104 can include information representing features of the completed integrated circuit such as the location of drain/source areas of transistors, interconnect metallization, and the like. The flow proceeds to node 804 where photo-masks are manufactured and provided to an integrated circuit wafer-fabrication facility. The flow proceeds to node 806 where an integrated circuit wafer is manufactured using the photo-masks. The flow proceeds to node 808 where integrated circuit devices are manufactured from integrated circuit die included at the integrated circuit wafer.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed.

Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

What is claimed is:
1. A method comprising:
 receiving a design file representative of a data processing device;
 receiving at a computer a first frequency value indicating a frequency of a first external clock signal to be provided to a first external interface of the data processing device;
 receiving at the computer a second frequency value indicating a frequency of a second external clock signal to be provided to a second external interface of the data processing device;
 identifying a plurality of internal clock signals corresponding to internal nodes of the data processing device, the internal clock signals generated internally by one or more modules of the data processing device;
 for each internal clock signal of the plurality of internal clock signals, determining a multiplier expressing a ratio between a frequency of the internal clock signal and the first frequency value, thereby determining a plurality of multipliers;
 determining at the computer a first least common multiple representing a least common multiple of the plurality of multipliers;
 determining at the computer a second least common multiple representing a least common multiple of the first frequency value and the second frequency value;
 determining at the computer a first pulse width of the first external clock signal based on the first least common multiple and the second least common multiple; and simulating operation of the data processing device based on the first external clock signal having the first pulse width.

2. The method of claim 1, further comprising:
determining a subset of the plurality of internal clock signals based on configuration information, the subset excluding at least one of the plurality of internal clock signals; and
wherein determining the first least common multiple comprises determining the first least common multiple based only on a subset of the plurality of multipliers associated with the subset of the plurality of internal clock signals.

3. The method of claim 2, wherein determining the subset of the plurality of internal clock signals comprises:
determining, based on the configuration information, that a first clock domain of the data processing device is not to be simulated; and
excluding a clock signal associated with the first clock domain from the subset of the plurality of internal clock signals.

4. The method of claim 1, further comprising:
in response to determining, based on configuration information, that a first clock domain of the data processing device is to be simulated in a first mode of operation:
adjusting a first frequency value of a first clock of the plurality of internal clock signals by a first factor to determine an adjusted frequency value; and
determining the first least common multiple based on the first adjusted frequency value.

5. The method of claim 4, further comprising:
in response to determining that the first clock domain is to be simulated in a second mode of operation, determining the first least common multiple based on the first frequency value without adjusting the first frequency value by the first factor.

6. The method of claim 5, wherein the first mode of operation comprises a synchronous mode of operation and the second mode of operation comprises an asynchronous mode of operation.

7. The method of claim 1, further comprising:
determining, based on configuration information, that a first clock generation module of the data processing device is associated with a clock adjustment factor;
adjusting a first frequency value of a first clock of the plurality of internal clocks by the clock adjustment factor to determine an adjusted frequency value; and
determining the first least common multiple based on the adjusted frequency value.

8. The method of claim 1, further comprising:
determining a pulse width of the second external clock signal based on the first least common multiple and the second least common multiple.

9. The method of claim 1, further comprising:
adjusting the design file of the data processing device based on simulating operation of the data processing device; and
forming an integrated circuit based on the design file.

10. A method, comprising:
receiving a design file representative of a data processing device;
determining at a computer a plurality of external clock signals to be simulated, each external clock signal of the plurality of external clock signals to be provided to corresponding external interfaces of the data processing device, the plurality of external clock signals including a first external clock signal having a first frequency;
determining at the computer a plurality of internal clock signals of the data processing device, the internal clock signals corresponding to internal nodes of the data processing device, the internal clock signals generated internally by one or more modules of the data processing device;
for each internal clock signal of the plurality of internal clock signals, determining a ratio between a frequency of the internal clock signal and the first frequency, thereby determining a plurality of frequency ratios;
determining at the computer a first least common multiple representing a least common multiple of the plurality of frequency ratios;
determining at the computer a second least common multiple representing a least common multiple of a frequency of each of the plurality of external clock signals;
setting a number of simulation time intervals associated with the first external clock signal to be simulated based on the first least common multiple and the second least common multiple; and
simulating, at the computer operation of the data processing device based on the first external clock signal by determining a simulated state of the data processing device at each of the simulation time intervals.

11. The method of claim 10, further comprising:
in response to determining that a first clock domain of the data processing device is to be simulated, including a first internal clock signal associated with the first clock domain in the plurality of internal clock signals; and
in response to determining a second clock domain available of the data processing device is not to be simulated, excluding a second internal clock signal associated with the second clock domain from the plurality of internal clock signals.

12. A non-transitory computer readable medium storing a set of instructions, the set of instructions comprising instructions to manipulate a processing system to:
determine a first least common multiple representing a least common multiple of a first plurality of frequency values, each of the first plurality of frequency values indicating a frequency of a corresponding one of a plurality of external clock signals available to be simulated, each external clock signal of the plurality of external clock signals to be provided to a corresponding external interface of a data processing device to be simulated, the plurality of external clock signals including a first external clock signal having a first frequency;
determine a second least common multiple representing a least common multiple of plurality of a frequency ration, each frequency ratio of the plurality of frequency ratios expressing a ratio between a frequency of an internal clock signal of a plurality of internal clock signals and the first frequency, the internal clock signals corresponding to internal nodes of the data processing device, the internal clock signals generated internally by of one or more modules of the data processing device;
determine a first pulse width of a first clock signal of the plurality of clock signals based on the first least common multiple and the second least common multiple; and
simulate operation of the data processing device based on the first external clock signal having the first pulse width.

13. The computer readable medium of claim 12, wherein the set of instructions further comprises instructions to:

determine a subset of the plurality of internal clock signals based on configuration information, the subset excluding at least one of the plurality of internal clock signals; and wherein determining the second least common multiple comprises determining the second least common multiple based on a subset of the plurality of frequency ratios associated with the subset of the plurality of internal clock signals.

14. The computer readable medium of claim 13, wherein the instructions to determine the subset of the plurality of clock signals comprise instructions to:

determine, based on the configuration information, that a first clock domain of the data processing device is not to be simulated; and exclude a clock signal associated with the first clock domain from the subset of the plurality of internal clock signals.

15. The computer readable medium of claim 13, wherein the set of instructions further comprises instructions to:

in response to determining, based on configuration information, that a first clock domain of the data processing device is to be simulated operating in a first mode:

adjust a first frequency value of a first clock of the plurality of internal clock signals by a first factor to determine an adjusted frequency value; and determine the second least common multiple based on the first adjusted frequency value.

16. The computer readable medium of claim 15, wherein the set of instructions further comprises instructions to:

in response to determining that the first clock domain is to be simulated operating in a second mode, determine the second least common multiple based on the first frequency value without adjusting the first frequency value of the first clock of the plurality of internal clock signals by the first factor.

17. The computer readable medium of claim 16, wherein the first mode comprises a synchronous mode of operation and the second mode comprises an asynchronous mode of operation.

18. The computer readable medium of claim 13, wherein the set of instructions further comprises instructions to:

in response to determining, based on configuration information, that a first clock generation module of the data processing device is associated with a clock adjustment factor:

adjust a first frequency value of a first clock of the plurality of internal clocks by the clock adjustment factor to determine an adjusted frequency value; and determine the second least common multiple based on the first adjusted frequency value.

* * * * *